(12) United States Patent
Fein et al.

(10) Patent No.: US 7,653,779 B1
(45) Date of Patent: Jan. 26, 2010

(54) MEMORY STORAGE USING A LOOK-UP TABLE

(76) Inventors: Gene Fein, 29712 Zuma Bay Way, Malibu, CA (US) 90265; Edward Merritt, 139 Lime Kiln Rd., Lenox, MA (US) 01240

( * ) Notice: Subject to any disclaimer, the term of this patent is extended or adjusted under 35 U.S.C. 154(b) by 0 days.

(21) Appl. No.: 12/365,772

(22) Filed: Feb. 4, 2009

(51) Int. Cl.
*G06F 12/00* (2006.01)
*G11C 16/00* (2006.01)
(52) U.S. Cl. .................... 711/103; 365/185.11
(58) Field of Classification Search ............. 711/103; 365/185.11
See application file for complete search history.

(56) References Cited

U.S. PATENT DOCUMENTS 6,094,368 A * 7/2000 Ching ............... 365/49.15

2006/0028686 A1 2/2006 Bergman et al. ........... 382/251
2007/0208905 A1* 9/2007 Litsyn et al. .............. 711/103
2007/0263454 A1 11/2007 Cornwell et al. ....... 365/185.24

FOREIGN PATENT DOCUMENTS

WO 02/103531 12/2002
WO 2005/089165 9/2005

* cited by examiner

*Primary Examiner*—Shane M Thomas
(74) *Attorney, Agent, or Firm*—Greenberg Traurig, LLP

(57) ABSTRACT

Data is stored in a flash or other memory using a look-up table, which includes a plurality of data elements, to encode and decode the data. An amount of charge to be stored in each memory cell is calibrated to correspond to one of the data elements in the look-up table. Data is retrieved from the memory by decoding using the look-up table. The amount of charge in the memory cells is determined, for example, by reading a voltage level from the cell. The charge or voltage level is matched to a corresponding one of the data elements in the look-up table.

20 Claims, 5 Drawing Sheets

116        Look-Up Table

| Data Element: Word | Voltage Reading |
|---|---|
| the | V1 |
| of | V2 |
| to | V3 |
| and | V4 |
| a | V5 |
| in | V6 |
| is | V7 |
| it | V8 |
| you | V9 |
| that | V10 |
| he | V11 |
| was | V12 |
| for | V13 |
| on | V14 |
| are | V15 |
| with | V16 |
| as | V17 |
| I | V18 |
| his | V19 |
| ... | ... |

FIG. 5

MEMORY STORAGE USING A LOOK-UP TABLE

RELATED APPLICATIONS

Each of the following applications is incorporated herein by reference in its entirety:

U.S. application Ser. No. 12/273,933, filed Nov. 19, 2008, by Fein et al., titled "CODED PULSE DATA TRANSMISSION USING A LOOK-UP TABLE"; and U.S. application Ser. No. 12/348,213, filed Jan. 2, 2009, by Fein et al., titled "ELECTRICAL PULSE DATA TRANSMISSION USING A LOOK-UP TABLE".

FIELD OF THE TECHNOLOGY

At least some embodiments disclosed herein relate to memory storage systems in general, and more particularly, but not limited to, memory storage using a look-up table.

BACKGROUND

Memory or data storage devices are used, for example, to store program instructions that may be executed by processors. Data storage devices have also been used to store other types of data, including, for example, audio, image, and/or text information (e.g., text associated with a Microsoft Word document). Recently, systems with data storage devices capable of storing substantial data content (e.g., songs, music videos, etc.) have become widely available in portable devices (e.g., Apple's iPod and iPhone devices).

Such portable devices include data storage devices (DSDs) that have small form factors and are capable of operating from portable power sources, such as batteries. Some DSDs in portable devices may provide non-volatile memory that is capable of retaining data when disconnected from the power source. Portable devices have used various non-volatile data storage devices, such as hard disk drives, EEPROM (electrically erasable programmable read only memory), and flash memory.

Flash memory has become a widely used type of DSD. Flash memory may provide, for example, a non-volatile memory in portable electronic devices and consumer applications. Two types of flash memory are NOR flash and NAND flash. NOR flash typically provides the capacity to execute code in place, and is randomly accessible (i.e., like a RAM). NAND flash can typically erase data more quickly, access data in bursts (e.g., 512 byte chunks), and may provide more lifetime erase cycles than comparable NOR flash. NAND flash may generally provide non-volatile storage at a low cost per bit as a high-density file storage medium for consumer devices, such as, for example, digital cameras and MP3 players.

Typical flash memory stores a unit of information by storing an electrical charge in each memory cell at a voltage representative of a binary value. Single level cells store one bit of information based on the cell being charged to a "high" voltage, or being discharged to a "low" voltage.

BRIEF DESCRIPTION OF THE DRAWINGS

The embodiments are illustrated by way of example and not limitation in the figures of the accompanying drawings in which like references indicate similar elements.

FIG. 5 shows an exemplary look-up table containing commonly-used words in the English language, according to one embodiment.

DETAILED DESCRIPTION

Figure 1:
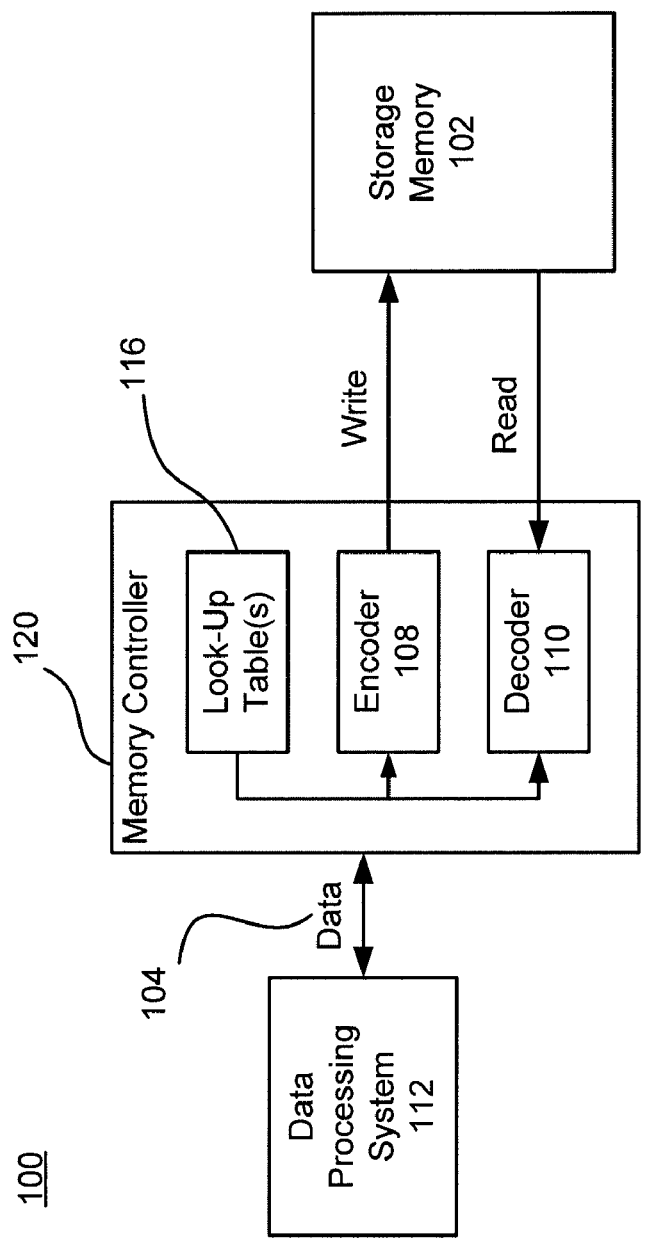
FIG. 1 shows a block diagram of a system for memory storage of data, according to one embodiment.

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

As used herein, a "look-up table" includes any reference table, library, or stored information that provides a set of data elements for reference during the encoding or decoding of stored data. The data elements in a look-up table may include, for example, numbers, text (e.g., whole lengthy words or single letters), pixel points, colors, program commands, and other data or data strings that correspond to values, functions, or characteristics associated with information being stored. Data elements contained in the look-up tables of other embodiments may include, for example, computer program elements (e.g., portions of code commonly used in a given program language corresponding to encoded data that is stored).

In yet other embodiments, data elements may include pointers or references to other look-up tables. For example, a plurality of data elements in a first look-up table may include a data element that points to a second look-up table that includes a plurality of data elements for decoding data read from a storage memory.

The look-up table is typically identical for both encoding and decoding of stored data. In other embodiments, different look-up tables may be used for encoding or decoding (e.g., when a user of a mobile device changes a flash memory card that contains different look-up tables stored on the flash memory card).

Prior flash memory storage systems merely store information as bits or binary object code (i.e., ones and zeroes such as 110010 or 001101). For example, existing NAND flash memory systems are described as storing up to two bits of information in a single memory cell by decoding the charge as being within one of four different voltage ranges. Existing NOR flash memory systems are described as storing up to 8 bits of information in a single memory cell. Regardless of the particular flash memory implementation, existing storage is described as merely involving storage or data retrieval of bits of information.

Systems and methods for the memory storage of data using a look-up table are now described below. Generally, input data to be stored is encoded using a look-up table to provide encoded data for storage. A look-up table includes a plurality of data elements. In a flash memory embodiment (to be discussed as an exemplary embodiment below), an amount of charge to be stored in each flash memory cell is calibrated to correspond to one of the data elements in the look-up table. The encoded data is then stored in one or several memory cells by storing quantities of charge that correspond to the respective amounts of charge determined from the look-up table.

When data is desired to be retrieved from the memory, the data is decoded using a look-up table (e.g., this table is typically the same look-up table used to encode the stored data). This decoding includes measuring each amount of charge in the memory cells (e.g., by reading a voltage level from the cell using a voltage reader) to match the measured charge or each voltage read (e.g., from one or more memory cells) to a corresponding one of the data elements in the look-up table.

The use of look-up tables for storage data encoding and decoding as described herein is an improvement over the use of binary object code (i.e., 1's and 0's) for the storage of data (e.g., as in prior flash memory storage systems). The described approach typically provides greater efficiency of storage than prior approaches based on single bits of data.

FIG. 1 shows a block diagram of a system 100 for storage of encoded data in a storage memory 102 using memory controller 120, according to one embodiment. A data processing system 112 (or alternatively another system, not shown, that is coupled to memory controller 120) provides data 104 that is to be stored. System 100 includes an encoder 108 for encoding data 104 using one or more look-up tables 116, as discussed further below. The encoded data is written to storage memory 102 in a write operation.

Data processing system 112 may be, for example, a system that generates streaming video, a user client device playing a streaming video or audio player for the user, a high-definition television, or a telephone or other stationary or mobile communications or computing device.

As a specific example, data processing system 112 may be a portable or hand-held device having a display (not shown). Memory controller 120 and storage memory 102 may be enclosed within the device. In one embodiment, storage memory 102 may be coupled to the user device as a memory stick or cartridge or flash memory that is removable from the hand-held device by the end-user. Alternatively, storage memory 102 is a solid-state memory or embedded flash memory that is non-removable by the end-user.

In one embodiment, storage memory 102 is a flash memory (e.g., NOR or NAND memory), or another type of solid-state memory storage device (SSD). The flash memory may use single-level cell (SLC) or multi-level cell (MLC) structures. In other embodiments, storage memory 102 may be other types of non-volatile or volatile memory including a hard disk drive or other type of fixed data storage. An example of a memory system for multi-level data in a non-volatile semiconductor memory device (e.g., flash memory) is described in U.S. Pat. No. 6,788,572, issued Sep. 7, 2004, by Yamada et al., titled "NON-VOLATILE MULTI-LEVEL SEMICONDUCTOR FLASH MEMORY DEVICE AND METHOD OF DRIVING SAME", which is incorporated herein by reference in its entirety.

When data processing system 112 (or another system) requests data from memory 102, the stored data is decoded by a decoder 110 using one or more look-up tables 116, as discussed further below, and is provided as data 104 to system 112. Systems and methods for storing data in, and retrieving data from, flash memory cells are described in U.S. Patent Application Publication No. 2007/0263454, published Nov. 15, 2007, by Cornwell et al., titled "MAINTENANCE OPERATIONS FOR MULTI-LEVEL DATA STORAGE CELLS", which is incorporated herein by reference in its entirety.

Figure 2:
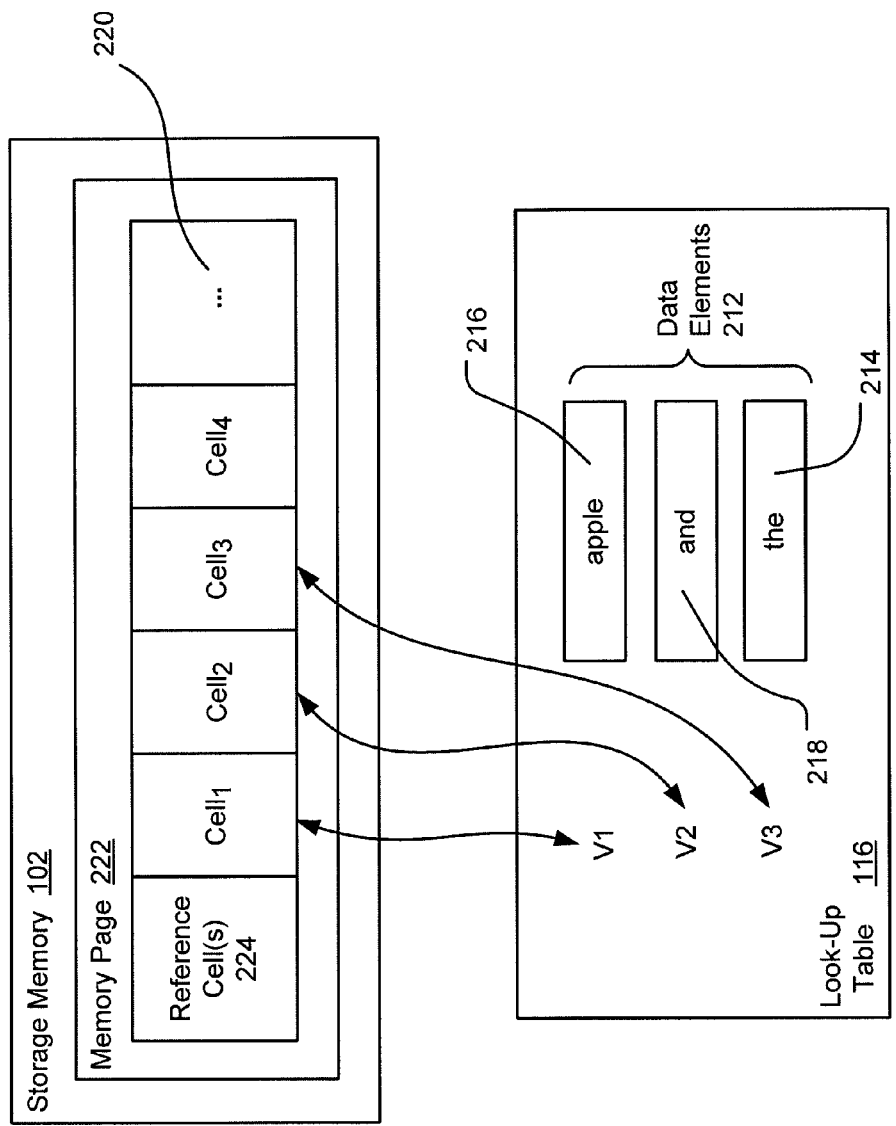
FIG. 2 shows an example of encoding/decoding data in a storage memory, according to one embodiment.

FIG. 2 shows an example of encoding/decoding data stored in storage memory 102, according to one embodiment. In this example, storage memory 102 is a flash memory having memory cells 220, arranged in a memory page 222. Memory cells 220 may include one or more reference memory cells 224, which may provide information to memory controller 120 to assist in memory storage or maintenance operations. Storage memory 102 typically has many such memory pages 222 (e.g., as used in conventional flash memory storage devices). Examples of flash memory structures (including reference cells) and controller memory interfaces are described in U.S. Patent Application Publication No. 2007/0263454 by Cornwell et al.

Data 104 received by memory controller 120 is encoded using data elements 212 from look-up table 116. These data elements typically correspond to the type of data (e.g., video, audio, or program) that is to be encoded for storage. Each data element 212 corresponds to a voltage (V1, V2, V3, etc.) that is used to program one or more memory cells 220 in storage memory 102, as discussed further below. For example, $Cell_1$ is programmed to a voltage V1, and $Cell_2$ is programmed to a voltage V2. In an alternative embodiment, each data element 212 may correspond to an amount of charge (e.g., a number of electrons) to be stored in a memory cell 220.

Decoding of data from storage memory 102 uses voltage levels detected in one or more memory cells 220 (e.g., during a read operation). These voltage levels (V1, V2, V3, etc.) are then matched to a corresponding data element 212 by a look-up using table 116.

As an example of the contents of look-up table 116, for encoding or decoding data 104 for a text document, exemplary data elements 214, 216, and 218 may include, respectively, the words "the", "apple", and "and". The types of data that may be encoded are numerous and include, for example, any type of images such as medical x-ray images and digital photography images, and various types of audio files.

In one embodiment, data elements 212 in a look-up table 116 correspond to functionality or content associated with a unique application or media format (e.g., a word-processing program such as Microsoft Word is one unique application). In the case of a word-processing application, the words "the", "apple", and "and" are content that will be, for example, displayed to a user of the application. The word-processing or other application may be stored, for example, in memory of data processing system 112 and be executed by processor(s) of system 112.

In another embodiment, a second look-up table may be used that contains data elements associated with yet another unique application or media format. A large number of look-up tables (e.g., stored in memory 304) may each be associated with its own unique application or media format, so that data 104 may be stored using the methods herein for a wide variety of types of data received for storage.

When reading data (e.g., reading voltages) from storage memory 102, the appropriate data element 212 for decoding is selected from the appropriate one of many look-up tables based on associating the data being read with the unique application or media format. In one embodiment, the unique application or media format is identified using a command read from storage memory 102 prior to performing a look-up. The command is used to select the look-up table that corresponds to the application or media format so that the data is properly decoded.

Other data elements in the table may be associated with functionality of the word-processing application by providing commands for formatting, or commands for executing functions or software modules that are part of the application. In this example, the data elements are higher-order data constructs as compared to mere binary object code (e.g., 1001, 1100, or 0010) translations as used in prior approaches.

In one embodiment, one or more of unique data elements 212 in look-up table 116 may each define a function that operates on another one or more other unique data elements 212 in look-up table 116. In another embodiment, one or more unique data elements 212 in look-up table 116 may be processed during execution of the unique application or media format using another one or more of the unique data elements 212 in look-up table 116.

Another example of a look-up table 116 is a set of data elements comprising Mandarin Chinese characters, such as used by an English-to-Mandarin translator program storing Mandarin character data (e.g., data processing system 112 may use this data to print or publish a Chinese character-based document or web site).

In yet another example, the data elements 212 in a look-up table 116 correspond to data constructs or translations for a given communications or encoding standard (e.g., MPEG-3 or MPEG-4, including the encoding of mixed media data such as video, audio, and speech). Data processing system 112 may execute an audio or video application to play a file retrieved from storage memory 102.

The size of look-up table 116 may be, for example, about 1-10 million data elements, or even billions of data elements or larger, depending on the embodiment. Look-up table 116 may be, for example, organized in logical blocks and pages, each corresponding to a look-up table for a particular application (e.g., that is executed on data processing system 112 or another system coupled to memory controller 120).

In one embodiment, data elements 212 of look-up table 116 are selected so that the more commonly occurring or used data 104 corresponds to more readily-read voltage levels (or alternatively smaller stored charges), as discussed further below. This typically will increase the efficiency of storage. For example, the word "the" is a common text string that would have a smaller stored charge. The word "apple" is less commonly used by a word-processing application than the word "the" and thus uses a larger stored charge. For example, a look-up table may include data elements selected based on a frequency of historical usage of each data element by the corresponding application or media format.

In one embodiment, the data 104 is, for example, video data (e.g., high definition (HD) television data). A number of look-up tables 116 may be used to encode such data, with the data elements in a first table being unique pixel locations in a video image, and data elements in a second table being colors for the video image. For example, if the data stored in storage memory 102 is video data, each data element may correspond to one of the following: (i) a data element defining a pixel location in a video image; (ii) a data element defining a color in a video image; or (iii) a data element defining a pixel location in a video image along with a specific color for the pixel location.

Figure 3:
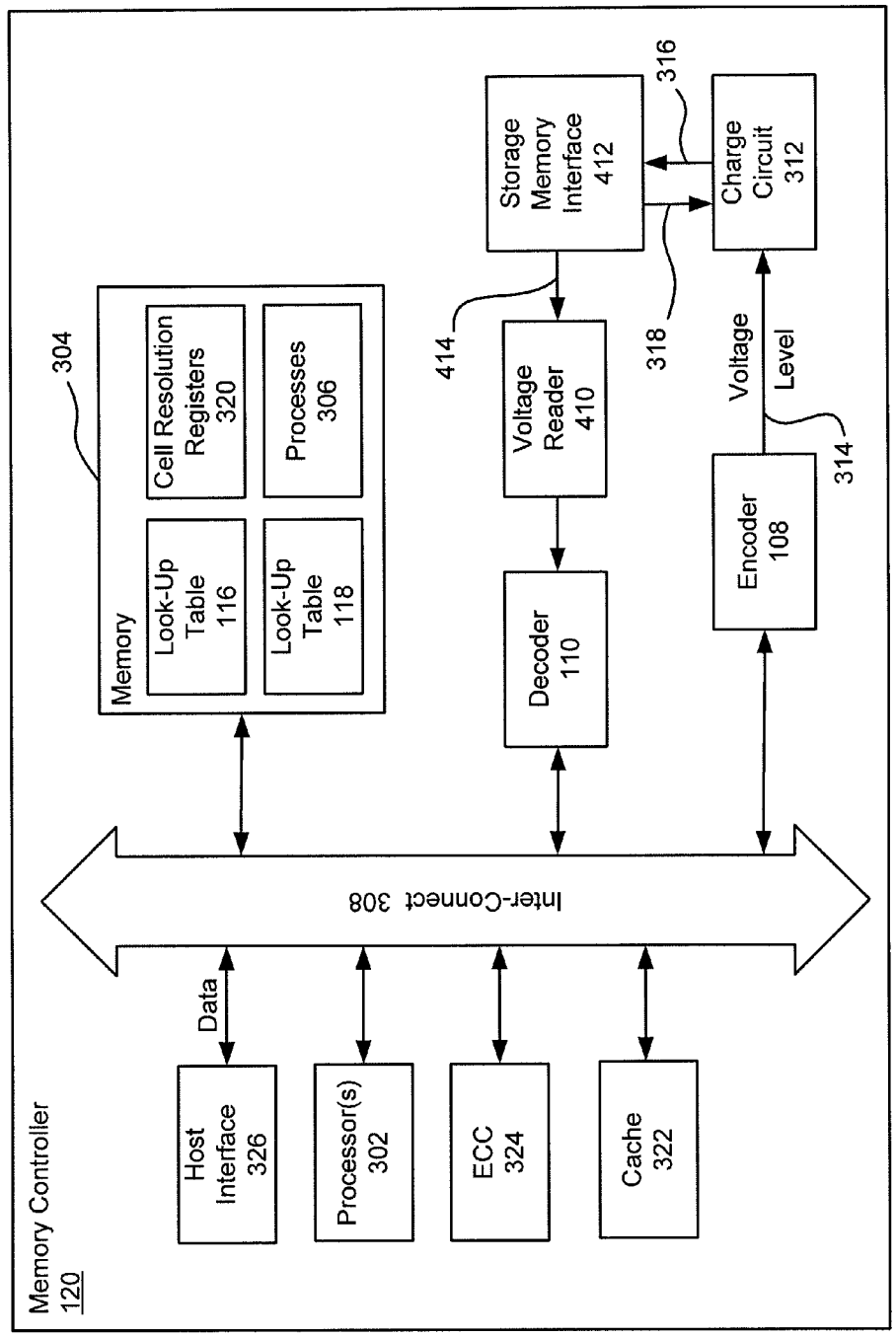
FIG. 3 shows a block diagram of memory controller, according to one embodiment.

In some embodiments, each memory cell 220 may be a flash memory cell that stores two or more voltage levels that may be detected or read during a read operation. For example, an article, incorporated herein by reference, titled "New flash memory tech challenges floating gate," published May 16-31, 2007, by EE Times-Asia (eetasia.com) describes MirrorBit technology that stores two physically distinct charges on opposite sides of a memory cell in a non-conducting nitride medium. This article may be found at the following hyperlink: http://www.eetasia.com/ARTICLES/2007MAY/PDF/EEOL_2007MAY16_STOR_TA.pdf?SOURCES=DOWNLOAD FIG. 3 shows a block diagram of memory controller 120, according to one embodiment. Controller 120 controls access to storage memory 102 (e.g., for data processing system 112 or another host system). Host interface 326 couples system 112 to controller 120. Storage memory interface 412 couples controller 120 to storage memory 102.

Controller 120 includes encoder 108 and decoder 110, briefly discussed above. Controller further includes one or more processors 302 and one or more memory devices 304 coupled by inter-connect 308 (e.g., a system bus). Memory devices 304 may include flash memory (e.g., NOR or NAND memory) or other types of solid-state memory storage devices (SSD), which may be written and read using conventional approaches.

In one embodiment, processors 302 may be implemented using, for example, the UltraSPARC T2 processor, which has eight cores (available from Sun Microsystems, Inc., of Santa Clara, Calif., USA). Each core can issue two instructions per cycle and can support eight threads, making a total of 64 virtual processors. The peak performance of the processor can be calculated by multiplying the frequency by the number of cores and the number of instructions that can be issued for each core. Assuming that both processors run at 1.4 GHz, then the UltraSPARC T1 processor can sustain 1.4×8=11.2 billion instructions per second, and the UltraSPARC T2 processor can sustain 22.4 billion instructions per second. Further information, incorporated herein by reference, is available at the following hyperlink: http://developers.sun.com/solaris/articles/tlt2_perf_counter.html Memory 304 stores, for example, information useful in the operation of controller 120 such as cell resolution registers 320 (e.g., that may be used to store information about cell resolution in each memory page 222 of storage memory 102). Look-up table 116 and a second look-up table 118 are stored in memory 304. Various processes 306 to be executed by processor(s) 302 may also be stored in memory 304. Additional look-up tables may be stored in memory 304 and/or in other storage devices that are accessible by controller 120 (e.g., hard drives on the same network). In an alternative embodiment, storage memory 102 may itself store a large number of look-up tables for use by controller 120 in encoding/decoding operations. In one embodiment, each look-up table 116 or 118 includes at least one hundred (or alternatively at least one thousand) unique data elements. In other embodiments, each table may include hundreds of thousands, or even millions of unique data elements.

Cache memory 322 may be used to store data to be written to, or data read from, storage memory 102. In an alternative embodiment, cache memory 322 may also, for example, be used to store look-up tables temporarily read from storage memory 102 to controller 120 for temporary use during encoding/decoding operations.

Encoder 108 receives and encodes incoming data elements by determining a voltage level corresponding to each of the incoming data elements using a look-up to the plurality of data elements in look-up table 116 or 118. Encoder 108 provides this voltage level 314 to charge circuit 312. Voltage level 314 is the target voltage to which charge circuit 312 will charge a memory cell in storage memory 102. Voltage level 314 may be, for example, values in the range of about 1-4 V. Charge circuit may receive data from cell resolution registers 320 for use during charging of memory cells 220.

Charge circuit 312 may be, for example, a charge pump as used in conventional flash memory storage. Charge circuit 312 provides a charge to a memory cell 220 through interface 412. In one embodiment, during charging, a feedback signal 318 is received from storage memory 102 to calibrate the charging of the memory cell. Cornwell et al. describe examples of charging a memory cell in U.S. Patent Application Publication No. 2007/0263454, incorporated by reference above. A description of a microvolt transmitter (LTM-WM Modbus & Serial Output Transmitter for Load Cell or Microvolt Input distributed by Laurel Electronics, Inc., of Costa Mesa, Calif.) is found at the following hyperlink: http://www.laurels.com/transmitter-modbus-loadcell.htm Memory controller 120 includes voltage reader 410, coupled to storage memory interface 412, for reading a voltage 414 from a memory cell of storage memory 102. Voltage reader 410 may be, for example, a sensing amplifier or circuit, a micro-volt charge reader, a multi-volt meter or metering circuit, or other conventional circuit for reading voltages with high resolution. Voltage reader 410 may, for example, be disposed on the same semiconductor chip (not shown) as storage memory 102.

As an example, voltage reader 410 may have a resolution of about one-millionth of a volt or greater (corresponding to about a million different voltage levels that may be stored). Higher resolutions for reading voltage may permit several millions of unique voltage levels or charges to be stored and read. For example, European patent application publication no. EP 0801398A2, published 15 Sep. 1997, by Tran et al., titled "Method and apparatus for analog storage using floating gate NAND structures," which is incorporated by reference in its entirety, describes resolving a voltage to about 10 millivolts over a range of 2.5 volts.

In one embodiment, voltage reader 410 determines the amount of charge stored in a multi-level memory cell by comparing the voltage maintained in the multi-level cell against various reference voltages (e.g., associated with reference cell(s) 224). For example, Christopherson et al. describe measurement of voltages and associated error correction approaches in U.S. Pat. No. 5,754,566, issued May 19, 1998, titled "METHOD AND APPARATUS FOR CORRECTING A MULTILEVEL CELL MEMORY BY USING INTERLEAVING", which is incorporated by reference in its entirety.

An example of a microvolt meter (a Laureate micro-voltmeter high-sensitivity monitor and controller for use with microvolt input signals, distributed by Laurel Electronics, Inc., of Costa Mesa, Calif.) is described at the webpage, incorporated by reference in its entirety, found at the following hyperlink: http://www.laurel-electronics.com/loadcell.htm Also, Brimmer et al. describe a microvolt meter in an article titled "A Simple Inexpensive 4½ Digit Microvolt Meter for Potentiometric Titrations," CHEM., BIOMED. AND ENVIRON. INSTRU., 12(3), 171-174 (1982), which is incorporated by reference in its entirety.

In an alternative embodiment, a charge sensing circuit for measuring the amount of charge stored in a memory cell may be used. The charge sensing circuit (or the voltage reader 410) may be implemented in conjunction with reference cells 224. Examples of the usage of reference cells for measurement of memory cells are described in U.S. Patent Application Publication No. 2007/0263454 by Cornwell et al., incorporated by reference above.

Memory controller 120 also includes an error checking and correction (ECC) circuit 324 to monitor and correct errors in reading memory cells. Conventional ECC methods may be used to assist in verifying a correct measurement of the voltage(s) associated with, or charge(s) stored in, a memory cell. Examples of ECC methods are also described in U.S. Patent Application Publication No. 2007/0263454 by Cornwell et al., which is incorporated herein by reference.

Voltage reader 410 provides a voltage value to decoder 110. In one embodiment, voltage reader 410 converts the voltage to a digital value to pass to decoder 110. Decoder 110 performs a look-up to decode the voltage value. In one embodiment, various functions of decoder 110 and encoder 108 may be implemented in software stored as processes 306 and executed by processor(s) 302.

A large number of different look-up tables (e.g., tables 116 or 118 or another table) may be stored in memory 304 (e.g., as used for encoding stored video data), and several tables may be used to encode different portions of incoming data to be stored. A command may be stored in storage memory 102 in order to identify the particular look-up table from the many accessible by encoder 108 in order to identify (for later decoding) those tables that were used to encode the data.

Similarly, for decoding stored data, as was mentioned above, numerous look-up tables stored in memory 304 may be used (e.g., for decoding stored video data). A command may be received from storage memory 102 so that decoder 110 can select the appropriate look-up table 116 or 118 or another table from the many look-up tables accessible by decoder 110.

As data elements 212 are selected from appropriate look-up tables, the selected data elements may be cached in cache 322 awaiting further processing or transfer of data from memory controller 120 via host interface 326.

Decoder 110 or processor 302 controls a comparison of the measured voltages from the memory cells against look-up table 116 (or the appropriately selected look-up table for the unique application or media format corresponding to the data being read). Decoder 110 or processor 302 retrieves data elements 212 from the appropriate look-up table 116 or 118, which can be selected using the command (or other type of pointer) retrieved from storage memory 102 during reading. In an alternative embodiment, the command or pointer information to select a look-up table corresponding to the data to be read is received from another system coupled to memory controller 120 (e.g., from data processing system 112 through host interface 326).

Each voltage level is associated with a data element 212 in a look-up table 116 or 118. As data elements 212 are retrieved from one or more look-up tables 116 or 118, decoder 110 or processor 402 controls the assembly and output of the retrieved data to provide output data (e.g., through host interface 326).

In one embodiment, the voltage levels can be set for a unique program situation. For example, a set of words each having a unique voltage level for a first type of data (e.g., word data) to be stored do not need to be included in the same look-up table as a set of colors, which could use some of the same voltage levels as used in the look-up table for the word data. As another example, a look-up table can be associated with various portions of a computer program, once the application programming interface (API) is known. This association can be handled by an intermediary service company and the look-up table does not need to be prepared by the original programmer of the computer program.

In one embodiment, at the start of every storage operation, the type of data to be stored may be defined (e.g., using a command as described above). For example, a video data storage operation may be defined by command data stored prior to (or even following in other embodiments) a series of voltage levels (e.g., as a header) corresponding to video data. This video command will be used to identify an appropriate unique look-up table. Similarly, a command may identify data for a word document, and be used to identify an appropriate unique look-up table for decoding a series of pulses for word data. A given voltage level can be re-used for different types of data storage (because a different look-up table will be selected for encoding/decoding).

In one embodiment, each of the commands for defining the unique application or media format may be a string of ones and zeroes (e.g., 1110001101010110), or may be a unique charge or voltage read from a memory cell. The unique charge or voltage is predefined as corresponding to a command, which itself defines the unique application or media format (e.g., a type of data such as audio or high definition video) and is used to select yet another look-up table for decoding. Also, one or more computer programs may each have a command predefined in this manner to make the storage and look-up table usage more efficient.

As mentioned above, the most readily-read voltage levels or smallest stored charge amounts may be used for the most-commonly stored data elements. In other embodiments, processes may be established to use the more-commonly used elements of a computer program for most readily-read voltage levels or smallest stored charge amounts.

In one non-limiting example, a high definition (HD) television data file (e.g., in a 1920×1080 format) is stored as the encoded data. It should be noted that in this example audio data is omitted from the calculations for purposes of simplified explanation. Storage times would be slightly longer when accounting for audio data, with audio data in 5.1 or better format requiring an even greater download time.

The quantity of HD data to be stored may be estimated as follows:

HD pixel specifications (1920×1080 pixels) multiplied by 60 frames per second=1920×1080×60=124,416,000 pixel data points/second of HD production.

Pixel color data points plus described colors for each pixel per second=2×124,416,000=248,832,000 points/second of HD production.

Thus, the total number of pixels plus the ascribed colors for each pixel is 248,832,000 data elements per second of HD production viewing. This does not include transition pulse codes, codes which define the end of a screen frame, an order to match pixels to color, an order to define pulses as colors/pixels, etc., which typically will only be a nominal portion of the total data to be stored. At a storage rate of 20 billion stored charges or voltage levels per second, with necessary gapping and variation spacing for individual characters and coding elements, an HD video storage time can be calculated as follows:

20,000,000,000 pulses per second divided by 248,832,000 data elements per second of HD production=80 seconds of an HD production stored per second.

This corresponds, for example, to a total storage time of about 90 seconds for a 2 hour HD movie.

Figure 4:
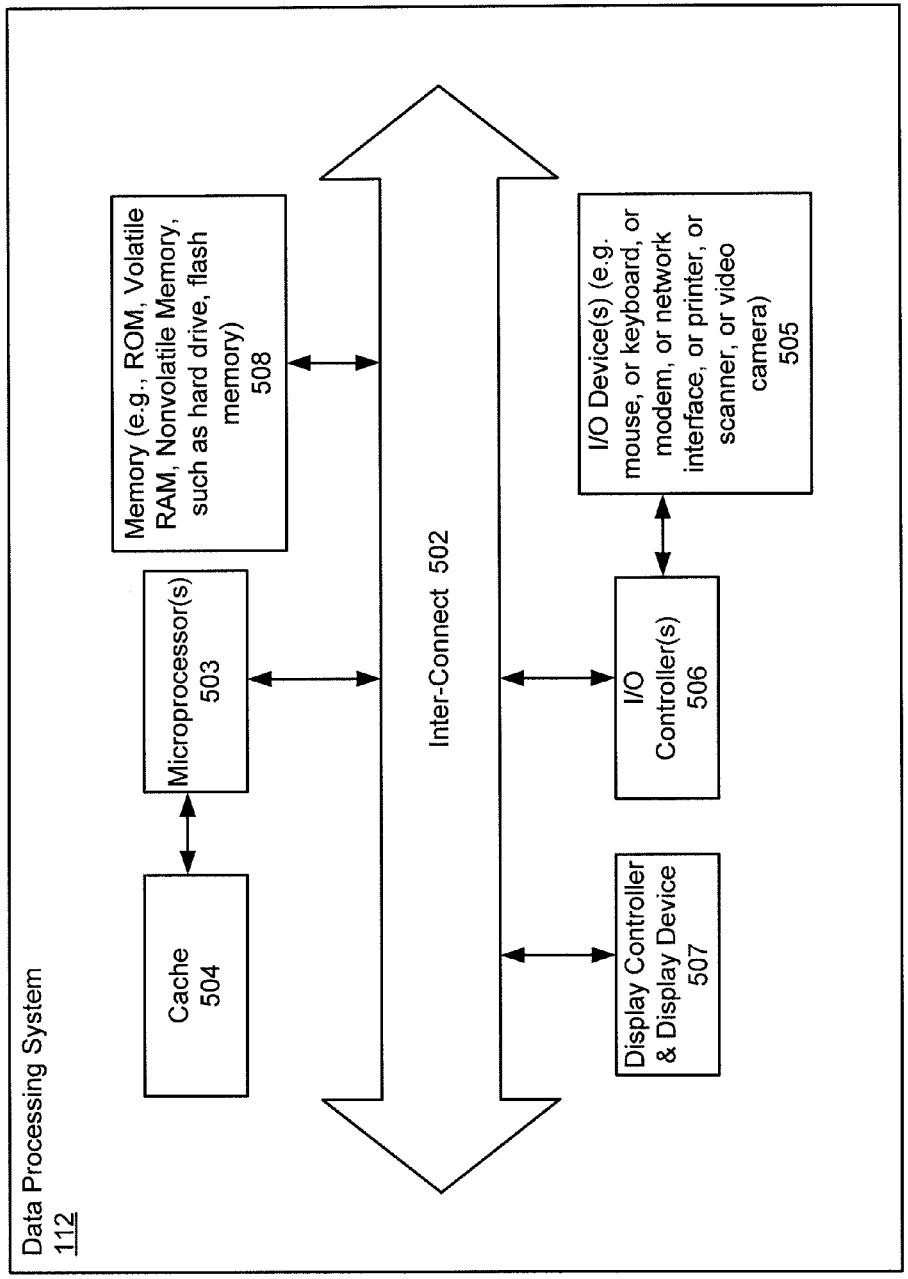
FIG. 4 shows a block diagram of a data processing system, which can be used in various embodiments to provide data for storage or use data retrieved from storage.

FIG. 4 shows a block diagram of a data processing system 112, which can be used in various embodiments to provide data for storage or use data retrieved from storage. Various components described here for FIG. 4 may also be used as components or portions of memory controller 120. While FIG. 4 illustrates various components of a computer system, it is not intended to represent any particular architecture or manner of interconnecting the components. Other systems that have fewer or more components may also be used.

In FIG. 4, data processing system 112 includes an inter-connect 502 (e.g., bus and system core logic), which inter-connects a microprocessor(s) 503 and memory 508. The microprocessor 503 is coupled to cache memory 504 in the example of FIG. 4.

The inter-connect 502 interconnects the microprocessor(s) 503 and the memory 508 together and also interconnects them to a display controller and display device 507 and to peripheral devices such as input/output (I/O) devices 505 through an input/output controller(s) 506. Typical I/O devices include mice, keyboards, modems, network interfaces, printers, scanners, video cameras and other devices which are well known in the art.

The inter-connect 502 may include one or more buses connected to one another through various bridges, controllers and/or adapters. In one embodiment the I/O controller 506 includes a USB (Universal Serial Bus) adapter for controlling USB peripherals, and/or an IEEE-1394 bus adapter for controlling IEEE-1394 peripherals.

The memory 508 may include ROM (Read Only Memory), and volatile RAM (Random Access Memory) and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, or an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In one embodiment, a data processing system as illustrated in FIG. 4 is used to implement a user terminal, which may receive streaming video or audio data. A user terminal may be in the form of a personal digital assistant (PDA), a cellular phone, a notebook computer or a personal desktop computer.

In some embodiments, one or more servers of the system can be replaced with the service of a peer to peer network of a plurality of data processing systems, or a network of distributed computing systems. The peer to peer network, or a distributed computing system, can be collectively viewed as a server data processing system.

Embodiments of the disclosure can be implemented via the microprocessor(s) 503 and/or the memory 508. For example, the functionalities described can be partially implemented via hardware logic in the microprocessor(s) 503 and partially using the instructions stored in the memory 508. Some embodiments are implemented using the microprocessor(s) 503 without additional instructions stored in the memory 508. Some embodiments are implemented using the instructions stored in the memory 508 for execution by one or more general purpose microprocessor(s) 503. Thus, the disclosure is not limited to a specific configuration of hardware and/or software.

FIG. 5 shows an exemplary look-up table 116 containing data elements that are some of the most commonly-used words 212 in the English language, according to one embodiment. Each word 212 corresponds to a voltage reading 514 (e.g., as read by voltage reader 410). Table 116 could contain, for example, hundreds, thousands, or even more of commonly-used words 212. Additional data elements could include, for example, document format commands or instructions, punctuation marks, etc.

In one embodiment, the most commonly-used words 212 each correspond respectively to voltages 514 that are most readily read (e.g., require the least amount of time to read or most readily read without an error) from storage memory 102. For example, in some embodiments, these most readily-read voltages may correspond to voltages for which resolution and/or accuracy is greatest.

In other embodiments, the most commonly-used words 212 may correspond to the smallest amount of charge storage in a memory cell, for which writing and/or reading the cell may require the least amount of time. For example, the counting of electrons stored in a cell may be performed most quickly for a smaller number of stored electrons.

In other embodiments, the above approach is used with one or more other application or media formats. For example, the most popular or commonly-used application or media format data elements would correspond to the most readily-read voltages or smallest stored charges, which would be provided in a unique look-up table associated with that unique application or media format.

In this description, various functions and operations may be described as being performed by or caused by software code to simplify description. However, those skilled in the art will recognize what is meant by such expressions is that the functions result from execution of the code by a processor, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The instructions may be embodied in digital and analog communication links for electrical, optical, acoustical or other forms of propagated signals, such as carrier waves, infrared signals, digital signals, etc.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method of retrieving data from a data storage system, the data storage system comprising a storage memory with a plurality of memory cells to store data, and the plurality of memory cells including a memory cell, the method comprising:

storing a plurality of look-up tables, each look-up table comprising a plurality of data elements, and each of the plurality of data elements in the respective look-up table associated with a unique application or media format;

detecting a voltage level from the memory cell during a read operation; and selecting a data element corresponding to the voltage level, the data element selected from one of the plurality of look-up tables based on associating data being read with the unique application or media format.

2. The method of claim 1, further comprising identifying the unique application or media format associated with the data being read using a command read from the storage memory prior to the selecting the data element.

3. The method of claim 1, wherein the plurality of data elements in each of the plurality of look-up tables comprises at least one hundred unique data elements.

4. The method of claim 1, wherein:
the memory cell is configured to store two or more voltage levels; and
the detecting the voltage level comprises detecting one of the two or more voltage levels.

5. The method of claim 1, wherein the memory cell is a flash memory cell.

6. A method of retrieving data from a data storage system, the data storage system comprising a storage memory with a plurality of memory cells to store data, and the plurality of memory cells including a memory cell, the method comprising:

storing a look-up table comprising a plurality of at least one hundred unique data elements, each of the data elements corresponding to functionality or content associated with an application;

detecting a voltage level from the memory cell during a read operation; and selecting a data element corresponding to the voltage level, the data element selected from the unique data elements in the look-up table.

7. The method of claim 6, wherein:
the detecting the voltage level comprises detecting the voltage level using a voltage reader; and
the selecting the data element comprises selecting the data element using a decoder coupled to receive the voltage level from the voltage reader.

8. The method of claim 6, wherein the storing the look-up table comprises selecting the data elements based on a frequency of historical usage of each data element by the application.

9. The method of claim 6, wherein:
the plurality of at least one hundred unique data elements comprises at least one thousand unique data elements; and
one or more of the unique data elements each defines a function that operates on another one or more of the unique data elements.

10. The method of claim 6, wherein:
the look-up table is a first look-up table; and
the plurality of data elements in the first look-up table comprises a data element that points to a second look-up table, the second look-up table comprising a plurality of data elements for decoding data read from the storage memory.

11. The method of claim 6, wherein:
the memory cell is configured to store two or more voltage levels; and
the detecting the voltage level comprises detecting one of the two or more voltage levels.

12. The method of claim 6, wherein:
the memory cell is configured to store two or more distinct sets of voltage levels, each set corresponding to a plurality of voltage levels; and
the detecting the voltage level comprises detecting a voltage level in one of the sets of voltage levels.

13. The method of claim 6, wherein:
the data stored in the storage memory is video data; and
each of the plurality of data elements corresponds to one of the following: (i) a data element defining a pixel location in a video image; (ii) a data element defining a color in a video image; or (iii) a data element defining a pixel location in a video image along with a specific color for the pixel location.

14. The method of claim 6, wherein one or more of the unique data elements are processed during execution by the application using another one or more of the unique data elements.

15. A system comprising:
a storage memory with a plurality of memory cells to store data;
a data processing system to generate incoming data from execution of an application in the data processing system, the incoming data comprising incoming data elements to be stored in the storage memory;
at least one memory configured to store a look-up table comprising a plurality of data elements, each of the data elements associated with the application, and each of the data elements corresponding to functionality or content for the application;
an encoder configured to receive the incoming data, the encoder further configured to encode the incoming data by determining a voltage level corresponding to each of the incoming data elements by a look-up to the plurality of data elements in the look up table; and
a charge circuit to generate charge and calibrate charging of the plurality of memory cell to the corresponding voltage levels, determined by the encoder, for the incoming data elements.

16. The system of claim 15, wherein:
the encoder is enclosed within a hand-held device comprising a display; and
the at least one memory comprises one or more of the following: a memory stick or cartridge or flash memory, the memory stick or cartridge or flash memory being removable from the hand-held device by an end-user; and a solid-state memory or embedded flash memory, the solid-state memory or flash memory being non-removable by the end-user.

17. The system of claim 15, wherein:
the charge circuit comprises a charge pump; and
the charge circuit is configured to receive a feedback signal from the storage memory for the calibration of the charging of the plurality of memory cells.

18. The system of claim 15, wherein the storage memory comprises the at least one memory.

19. The system of claim 15, wherein:
the at least one memory stores at least one cell resolution register; and
the charge circuit is configured to receive data from the at least one cell resolution register for use during a write operation.

20. The system of claim 15, wherein the plurality of memory cells comprises a memory cell with a non-conducting medium to store two or more distinct charges applied to the memory cell by the charge circuit during a write operation.

* * * * *